(12) United States Patent
Lee

(10) Patent No.: US 10,831,326 B2
(45) Date of Patent: Nov. 10, 2020

(54) SIGNAL PROCESSING METHOD FOR TOUCH SENSING APPARATUS AND TOUCH SENSING APPARATUS

(71) Applicant: Shang-Li Lee, Keelung (TW)

(72) Inventor: Shang-Li Lee, Keelung (TW)

(*) Notice: Subject to any disclaimer, the term of this patent is extended or adjusted under 35 U.S.C. 154(b) by 0 days.

(21) Appl. No.: 16/266,487

(22) Filed: Feb. 4, 2019

(65) Prior Publication Data

US 2019/0250735 A1 Aug. 15, 2019

(30) Foreign Application Priority Data

Feb. 14, 2018 (TW) .............................. 107105573 A

(51) Int. Cl.
*G06F 3/044* (2006.01)
*H03K 17/96* (2006.01)
*G06F 3/041* (2006.01)

(52) U.S. Cl.
CPC ............ *G06F 3/044* (2013.01); *G06F 3/0445* (2019.05); *G06F 3/0446* (2019.05); *G06F 3/04166* (2019.05); *H03K 17/962* (2013.01)

(58) Field of Classification Search
CPC ...... G06F 3/044; G06F 3/0445; G06F 3/0446; G06F 3/04166; G06F 3/0416; H03K 17/962

See application file for complete search history.

(56) References Cited

U.S. PATENT DOCUMENTS

2014/0152617 A1* 6/2014 Kida ....................... G06F 3/044
345/174
2015/0378469 A1* 12/2015 Xu ......................... G06F 3/0416
345/174

FOREIGN PATENT DOCUMENTS

TW 201621546 A 6/2016

\* cited by examiner

*Primary Examiner* — Amit Chatly
(74) *Attorney, Agent, or Firm* — Hauptman Ham, LLP

(57) ABSTRACT

A signal processing method for a touch sensing apparatus includes: sequentially dividing sensing signals of a plurality of sensing points on an entire panel into a plurality of signal sequences according to a batch in a signal generation order of the sensing points; and sequentially performing a plurality of signal processing procedures on the signal sequences.

4 Claims, 6 Drawing Sheets

| Sequentially divide sensing signals of sensing points on an entire panel into a plurality of signal sequences according to a batch in a signal generation order of the sensing points on the entire panel | S11 |

↓

| The signal sequences sequentially undergo a plurality of signal processing procedures | S13 |

SIGNAL PROCESSING METHOD FOR TOUCH SENSING APPARATUS AND TOUCH SENSING APPARATUS

CROSS-REFERENCE TO RELATED APPLICATION

This non-provisional application claims priority under 35 U.S.C. § 119(a) to Patent Application No. 107105573 in Taiwan, R.O.C. on Feb. 14, 2018, the entire contents of which are hereby incorporated by reference.

BACKGROUND

Technical Field

The present invention relates to the touch sensing technology, and in particular, to a signal processing method for a touch sensing apparatus and a touch sensing apparatus.

Related Art

To improve the convenience in use, an increasingly large number of electronic apparatuses use a touch screen as an operation interface, so that a user can directly tap a picture on a touch screen to perform an operation, thereby providing a more convenient and user-friendly operation mode. A touch screen mainly includes a display that provides a display function and a touch sensing apparatus that provides a touch control function.

Touch sensing apparatuses may include a resistive touch sensing apparatus, a capacitive touch sensing apparatus, an inductive touch sensing apparatus, an optical touch sensing apparatus, and the like according to sensing modes. A capacitive touch sensing apparatus is used as an example. During sensing, when the touch sensing apparatus detects a capacitance value change in a coordinate position, the sensing apparatus determines that the coordinate position is being touched by a user. Therefore, during operation, the sensing apparatus stores a capacitance value of each coordinate position without a touch, and when subsequently a latest capacitance value is received, the latest capacitance value is compared with the capacitance value without a touch to determine whether a position corresponding to the capacitance value is being touched.

However, after the touch sensing apparatus detects touch sensing signals (that is, capacitance values of all sensing points) on an entire panel, the touch sensing signal on the entire panel need to undergo a plurality of rounds of signal processing, resulting in restricted efficiency of processing and operation. Moreover, a relatively large transient memory space is used, and the overall effectiveness still has room for improvement by using relatively precise state synchronization between software and hardware.

SUMMARY

In view of the foregoing problem, the present invention is to provide a signal processing method for a touch sensing apparatus and a touch sensing apparatus, so as to resolve the problem of limited capability of processing a relatively large quantity of synchronization signals in time because the relative relationship between the use of resources and the quantity of signals presents nearly geometric progression when a relatively large quantity of hardware resources and a relatively long processing procedure are used at the same time during capturing of synchronous and real-time signals.

In an embodiment, a signal processing method for a touch sensing apparatus includes: sequentially dividing a plurality of sensing signals of a plurality of sensing points on an entire panel into a plurality of signal sequences according to a batch in a signal generation order of the sensing points; and sequentially performing a plurality of signal processing procedures on the signal sequences.

In an embodiment, a touch sensing apparatus includes: a plurality of drive electrode lines, a plurality of sensing electrode lines, a drive/detection unit, and a control unit. The plurality of drive electrode lines and the sensing electrode lines intersect with each other, and the drive electrode lines and the sensing electrode lines define a plurality of sensing points. The drive/detection unit is electrically connected to the drive electrode lines and the sensing electrode lines, and performs touch detection on the sensing points to generate sensing signals of the sensing points. The control unit is electrically connected to the drive/detection unit. The control unit includes: a sequence generation component and a plurality of signal processing components. The sequence generation component sequentially divides all sensing signals of the sensing points into a plurality of signal sequences according to a batch. The signal processing components are sequentially connected in series. The signal sequences sequentially undergo signal processing by the signal processing components.

In conclusion, for the signal processing method for a touch sensing apparatus and the touch sensing apparatus according to the present invention, a continuous transient technology can be used to perform a series of signal processing on touch sensing signals on an entire panel, thereby greatly reducing the quantity of required memories and shortening the signal transmission time in a signal processing procedure. In other words, the signal processing method for a touch sensing apparatus and the touch sensing apparatus according to the present invention can more efficiently use processing time and transient memory space, thereby improving the efficiency of a sensing process while keeping precise signal reading, and further improving the operation speed of touch control processing, improving the frames per second (FPS) or ensuring that an overall system has more time to perform more precise fine-adjusting operations.

BRIEF DESCRIPTION OF THE DRAWINGS

The present invention will become more fully understood from the detailed description given herein below for illustration only, and thus are not limitative of the present invention, and wherein.

DETAILED DESCRIPTION

First, a signal processing method for a touch sensing apparatus according to any embodiment of the present invention is applicable to a touch sensing apparatus. The touch sensing apparatus is, for example, but is not limited to, a touch panel, an electronic drawing board, and a graphic tablet. In some embodiments, the touch sensing apparatus may further be integrated with a display to form a touch screen. Moreover, the touch sensing apparatus may be touched by using a touch component such as a hand, a stylus or a touch brush.

Figure 1:
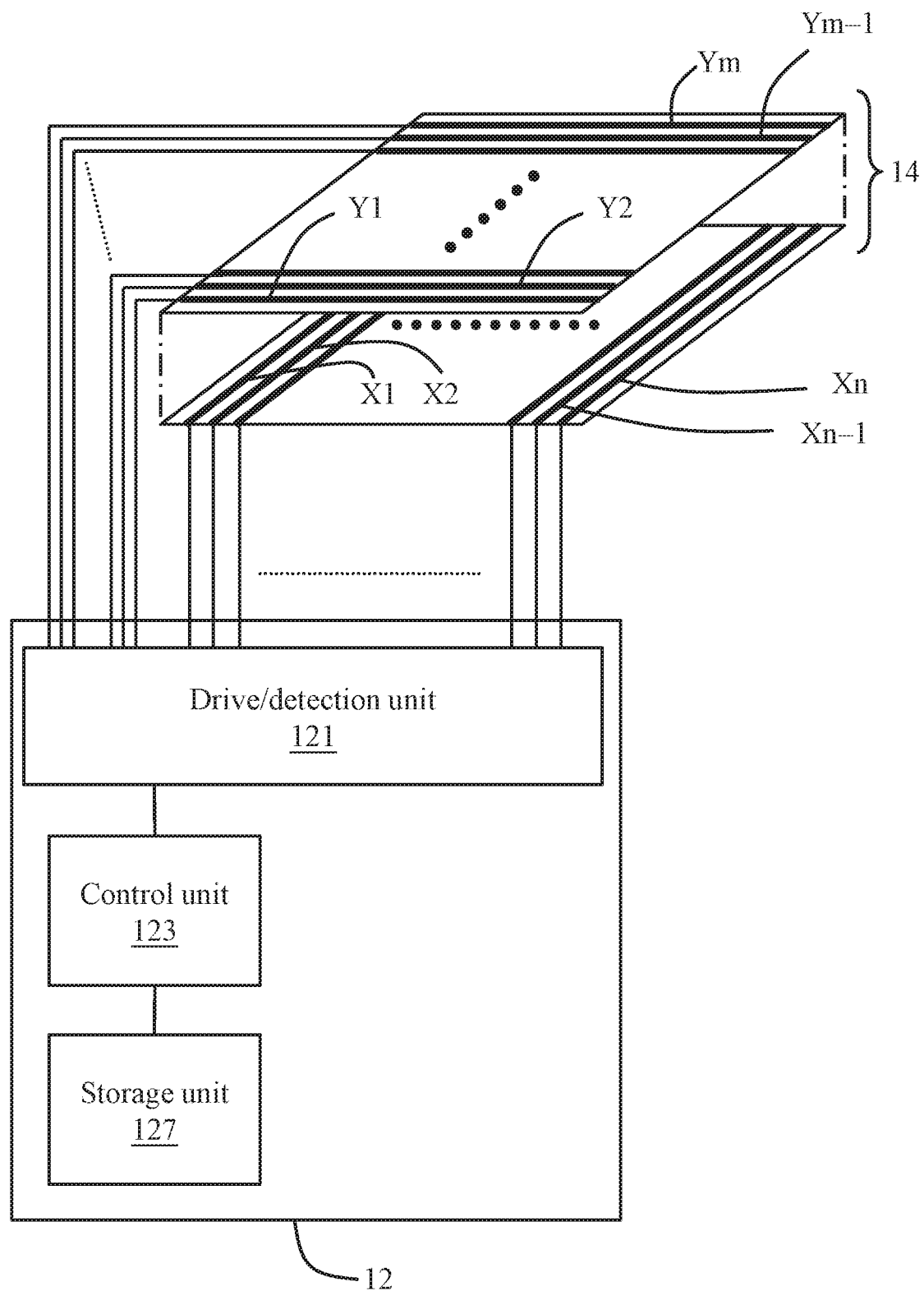
FIG. 1 is a schematic block diagram of a touch sensing apparatus according to an embodiment of the present invention.

FIG. 1 is a schematic block diagram of a touch sensing apparatus according to an embodiment of the present invention. Referring to FIG. 1, the touch sensing apparatus includes a signal processing circuit 12 and a signal sensor 14. The signal sensor 14 is connected to the signal processing circuit 12. The signal sensor 14 may be a resistive sensor, a capacitive sensor, an inductive sensor, an optical sensor or the like.

Figures 2, 3:
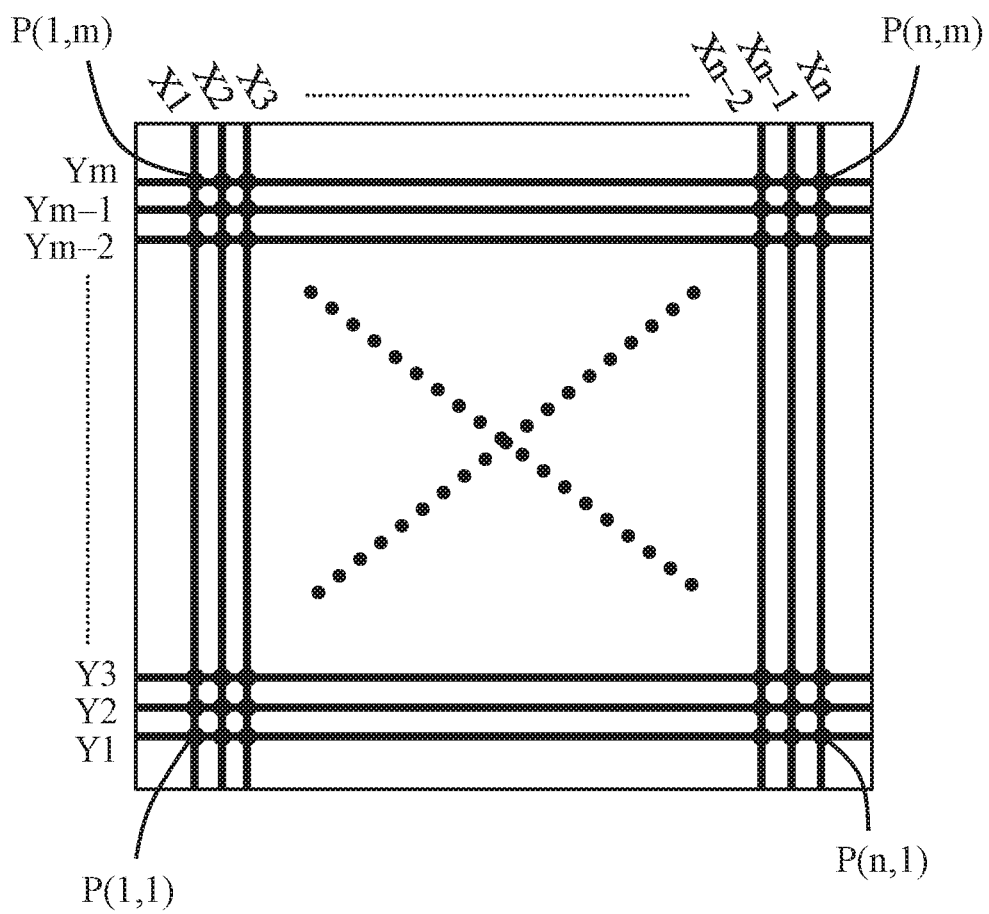
FIG. 2 is a schematic diagram of an embodiment of a signal sensor in FIG. 1.
FIG. 3 is a schematic flowchart of a signal processing method for a touch sensing apparatus according to an embodiment of the present invention.

A capacitive sensor is used as an example. The signal sensor 14 includes a plurality of electrodes (for example, drive electrode lines X1 to Xn and sensing electrode lines Y1 to Ym) that are arranged intersecting with each other, where n and m are positive integers, and n may be equal to m or unequal to m. As seen from the top, the drive electrode lines X1 to Xn and the sensing electrode lines Y1 to Ym intersect with each other, and define a plurality of sensing points P(1, 1) to P(n, m) that are arranged in a matrix, as shown in FIG. 2. In some embodiments, as seen from the top, the intersecting drive electrode lines X1 to Xn and sensing electrode lines Y1 to Ym have a rhombic beehive form, a mesh form or a grid form. In some embodiments, the drive electrode lines X1 to Xn and the sensing electrode line Y1 to Ym may be located in different planes (located on different sensing layers). An insulating layer (not shown in the figure) may be sandwiched between the different planes, but the present invention is not limited thereto. In some other embodiments, the drive electrode lines X1 to Xn and the sensing electrode lines Y1 to Yin may alternatively be located in a same plane, that is, are located on a single sensing layer.

The signal processing circuit 12 includes a drive/detection unit 121 and a control unit 123. The control unit 123 is coupled to the drive/detection unit 121. The drive/detection unit 121 includes a drive component and a detection component. Here, the drive component and the detection component may be integrated into a single component, or may be implemented by two components, depending on a situation during design. The drive component is configured to output a drive signal to drive the sensing points (for example, sequentially output drive signals to the drive electrode lines X1 to Xn). The detection component is configured to measure a sensing signal of each sensing points (for example, any sensing electrode line is used to measure a capacitance value of a sensing point formed of the sensing electrode line and the driven drive electrode lines). Here, the control unit 123 can be configured to control the operation of the drive/detection unit 121 and determine a capacitance value change of each sensing point according to a background signal (a determined capacitance value without a touch) and a sensing signal (a capacitance value about whether a touch to be detected occurs).

Here, when the drive/detection unit 121 performs touch detection on all the sensing points P(1, 1) to P(n, m) (that is, scans an entire panel) to generate sensing signals (that is, sensing signals on the entire panel) of the sensing points P(1, 1) to P(n, m), the control unit 123 can use a continuous transient technology to perform a series of signal processing (for example, analog-to-digital conversion, filtering, attenuation, and signal shaping) on the sensing signals on the entire panel.

A signal processing procedure of the touch sensing apparatus is further described below in detail.

Figure 4:
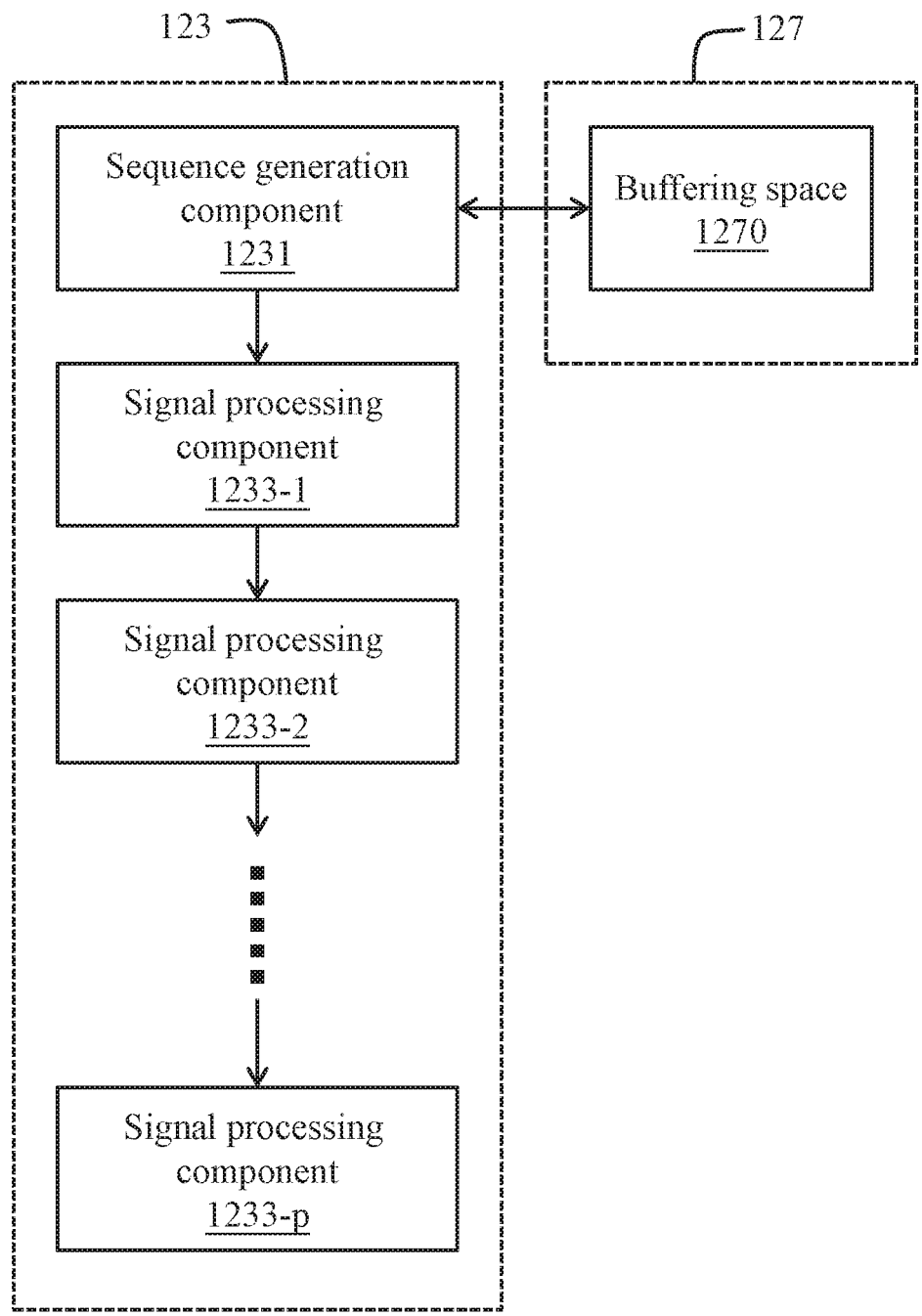
FIG. 4 is a schematic block diagram of an embodiment of a control unit in FIG. 1.

FIG. 3 is a schematic flowchart of a signal processing method for a touch sensing apparatus according to an embodiment of the present invention. FIG. 4 is a schematic block diagram of an embodiment of the control unit 123 in FIG. 1.

Referring to FIG. 1 to FIG. 4, the control unit 123 may include a sequence generation component 1231 and a plurality of signal processing components 1233-1 to 1233-$p$. The sequence generation component 1231 and the signal processing components 1233-1 to 1233-$p$ are sequentially connected in series. Each of the signal processing components 1233-1 to 1233-$p$ respectively performs a signal processing procedure. In some embodiments, the signal processing circuit 12 may include a storage unit 127, and the storage unit 127 is coupled to the control unit 123, where p is a positive integer greater than or equal to 2.

The sequence generation component 1231 sequentially divides sensing signals of sensing points P(1, 1) to P(n, in) on an entire panel into a plurality of signal sequences according to a batch in a signal generation order of the sensing points P(1, 1) to P(n, m) on the entire panel (Step S11). The batch is a maximum quantity of sensing signals of sensing points in each signal sequence.

The signal sequences sequentially undergo signal processing by the signal processing components 1233-1 to 1233-$p$ (Step S13).

For example, the sensing signals on the entire panel are divided into a first signal sequence to a $k^{th}$ signal sequence, where k is a positive integer greater than or equal to 2. At a first moment, the first signal sequence first undergoes signal processing by the signal processing component 1233-1. At a second moment, the first signal sequence that has undergone processing by the signal processing component 1233-1 undergoes signal processing by the signal processing component 1233-2. The second signal sequence continues to undergo signal processing by the signal processing component 1233-1. At a third moment, the first signal sequence that has undergone processing by the signal processing component 1233-2 undergoes signal processing by the signal processing component 1233-3. The second signal sequence that has undergone processing by the signal processing component 1233-1 undergoes signal processing by the signal processing component 1233-2. A third signal sequence continues to undergo signal processing by the signal processing component 1233-1. This process is repeated until a last signal sequence (that is, the $k^{th}$ signal sequence) has undergone signal processing by the last signal processing component 1233-$p$. In other words, the control unit 123 performs signal processing procedures by using one signal sequence as a unit.

In an embodiment, sensing signals on the entire panel that are generated by a drive/detection unit 121 may first be stored in a buffering space 127-0 of the storage unit 127 to perform a subsequent series of signal processing. When reading sensing signals on the entire panel from the buffering space 127-0, the sequence generation component 1231 can set the sensing signals on the entire panel into a plurality of signal sequences according to a batch in a signal generation order. An example in which the batch has j signals is used. The sequence generation component 1231 reads sensing signals of first j sensing points of the sensing signals on the entire panel from the buffering space 127-0, uses the sensing signals as the first signal sequence, and provides the first signal sequence to a first-stage signal processing component 1233-1 for signal processing. After the first-stage signal processing component 1233-1 outputs the first signal sequence, the sequence generation component 1231 then reads sensing signals of subsequent j sensing points of the sensing signals on the entire panel from the buffering space 127-0, uses the sensing signals as the second signal sequence, and provides the second signal sequence to the first-stage signal processing component 1233-1 for signal processing. This process is repeated until sensing signals of all the sensing points P(1, 1) to P(n, m) have been read, where j is a positive integer greater than 1 and less than n*m.

In another embodiment, when the drive/detection unit 121 generates the sensing signals on the entire panel, the sequence generation component 1231 can segment, according to a batch in a signal generation order, signals that are obtained through one time of panel scan by the drive/detection unit 121, to sequentially obtain the signal sequences (that is, each of a plurality of signal sequences of the sensing signals on the entire panel). Moreover, after obtaining each signal sequence, the sequence generation component 1231 immediately supplies the signal sequence to the first-stage signal processing component 1233-1 for signal processing. In this case, the buffering space 127-0 may be omitted. An example in which the batch has j signals is used. When the drive/detection unit 121 scans the entire panel, the sequence generation component 1231 sequentially receives sensing signals of the sensing points generated by the drive/detection unit 121, forms one signal sequence every time sensing signals of j sensing points have been received, and immediately supplies the signal sequence to the first-stage signal processing component 1233-1 for signal processing, where j is a positive integer greater than 1 and less than n*m.

In other words, the signal sequences include the sensing signals of all the sensing points P(1, 1) to P(n, m). For example, it is assumed that a quantity of signal sequences is k, a batch has j signals, and each signal sequence has sensing signals of j sensing points, where k*j=n*m.

In some embodiments, the signal processing components 1233-1 to 1233-$p$ may include at least one of an analog-to-digital converter, a filter, an attenuator and a signal shaper.

Figure 5:
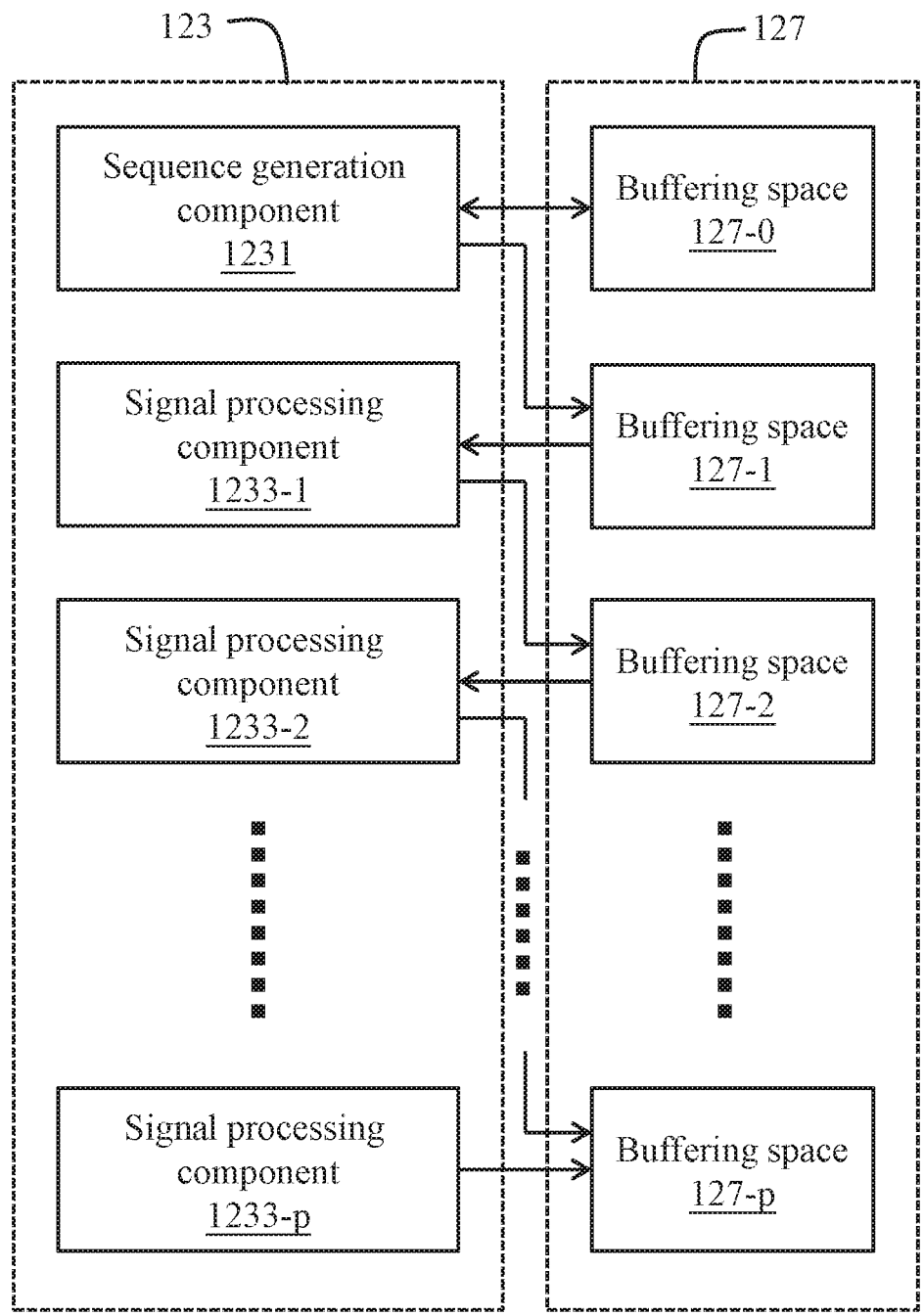
FIG. 5 is a schematic block diagram of another embodiment of a control unit in FIG. 1.

In some embodiments, referring to FIG. 5, the storage unit 127 may further include a plurality of buffering spaces 127-1 to 127-$p$ respectively corresponding to the signal processing components 1233-1 to 1233-$p$. In this case, a signal sequence that has undergone signal processing by a signal processing component is first temporarily stored in a buffering space corresponding to the signal processing component and then undergoes signal processing by a next signal processing component. For example, the sensing signals on the entire panel are divided into a first signal sequence to a $k^{th}$ signal sequence, where k is a positive integer greater than or equal to 2. First, the first signal sequence is read by the sequence generation component 1231 and temporarily stored in a buffering space 127-1. At a first moment, the first signal sequence is read by the signal processing component 1233-1 from the buffering space 127-1 and undergoes signal processing. At a second moment, the first signal sequence that has undergone processing by the signal processing component 1233-1 is first temporarily stored in a buffering space 127-2. The second signal sequence is read from the sequence generation component 1231 and is temporarily stored in the buffering space 127-1. At a third moment, the second signal sequence is read by the signal processing component 1233-1 from the buffering space 127-1 and undergoes signal processing. The first signal sequence is read by the signal processing component 1233-2 from the buffering space 127-2 and undergoes signal processing. At a fourth moment, the second signal sequence that has undergone processing by the signal processing component 1233-1 is first temporarily stored in the buffering space 127-2. The first signal sequence that has undergone processing by the signal processing component 1233-2 is first temporarily stored in a buffering space 127-3. The third signal sequence is read by the sequence generation component 1231 and temporarily stored in the buffering space 127-1. This process is repeated until the last signal sequence (that is, the $k^{th}$ signal sequence) has undergone signal processing by the last signal processing component 1233-$p$. In other words, the control unit 123 performs signal processing procedures by using one signal sequence as a unit, and the signal sequence is first temporarily stored in a buffering space before undergoing any signal processing procedure. When a batch is smaller, each buffering space may be smaller.

Figure 6:
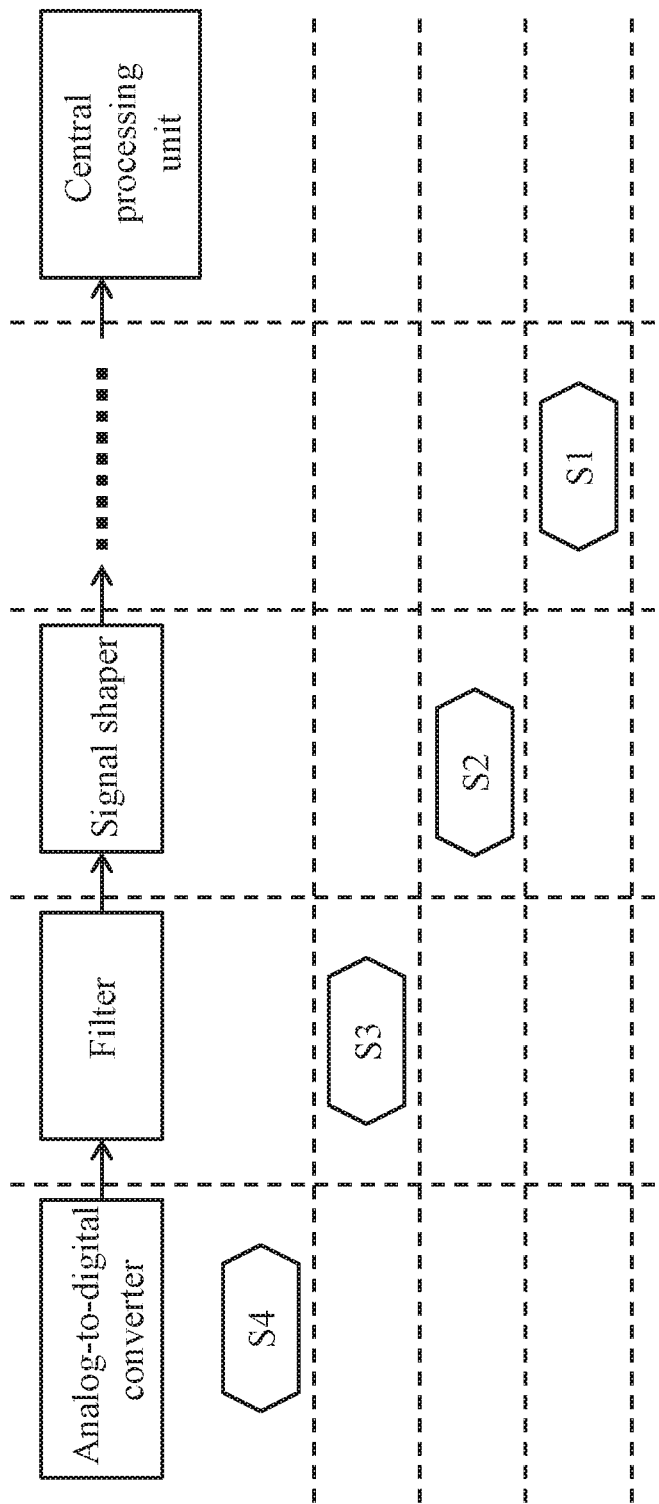
FIG. 6 is a schematic diagram of an example of Step SE in FIG. 3.

For example, referring to FIG. 6, it is assumed that the signal processing components are respectively an analog-to-digital converter, a filter, and a signal shaper. The sensing signals on the entire panel are divided into a first signal sequence S1 to a fourth signal sequence S4. The first signal sequence S1 to the fourth signal sequence S4 sequentially and respectively undergo signal processing by the analog-to-digital converter, the filter, and the signal shaper.

In an embodiment, the control unit 123 may be implemented by a central processing unit (CPU). In other words, the sequence generation component 1231 and the signal processing components 1233-1 to 1233-$p$ may be implemented by the CPU.

Figure 7:
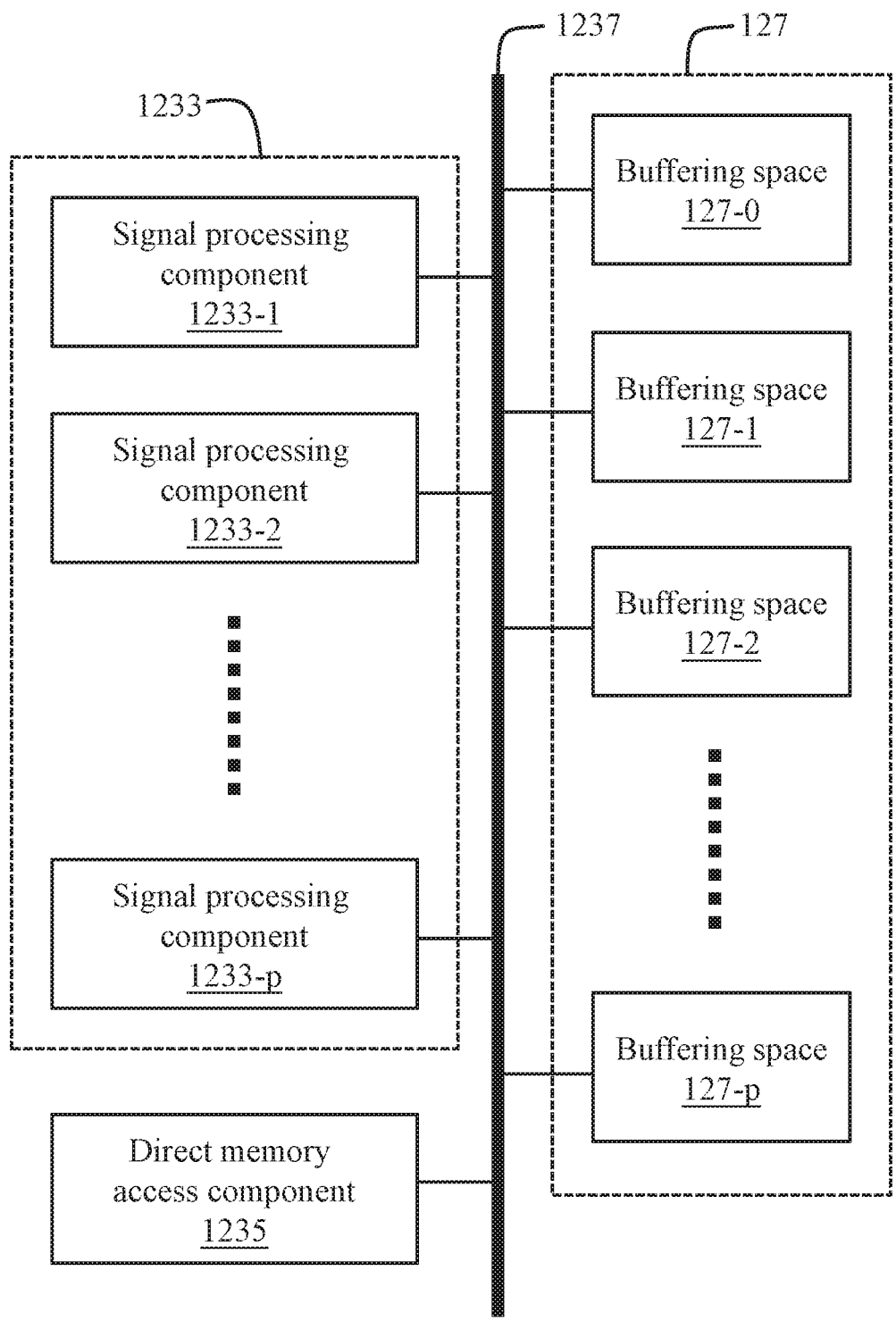
FIG. 7 is a schematic block diagram of still another embodiment of a control unit in FIG.

In an embodiment, referring to FIG. 7, the control unit 123 may be implemented by a CPU 1233 and a direct memory access (DMA) component 1235. The CPU 1233, the DMA component 1235, and the buffering spaces 127-1 to 127-$p$ are all coupled to a bus 1237. Here, the signal processing components 1233-1 to 1233-$p$ may be implemented by the CPU 1233. Moreover, the DMA component 1235 controls access operations of the signal processing components on buffering spaces corresponding to the signal processing components, to prevent the work of the CPU 1233 from being increased. In this case, the step (Step S11) of dividing a plurality of signal sequences can also be implemented by the DMA component 1235, that is, the sequence generation component 1231 is omitted.

In some embodiments, the signal processing circuit 12 may be implemented by one or more chips. In some embodiments, the storage unit 127 may further be configured to store related software/firmware programs, data, parameters, a combination thereof, and the like. Here, the storage unit 127 may be implemented by one or more memories.

In some embodiments, for the signal processing method for a touch sensing apparatus and the touch sensing apparatus according to the present invention, stages of signal processing may be synchronized in segments and transient memories (the buffering spaces 127-1 to 127-$p$) are used only for the requirement of the current work. Each signal sequence is circulated in different segments of hardware (signal processing components) a staged rotary manner, and at the same time the used transient memories also perform rotary actions [Acquire]%[Lock]>[Use]>[Finish]>[Release], so that required results can be gathered more rapidly in a manner of saving more software and hardware resources, thereby shortening an overall period of time. For example, for a touch control application, the FPS can be increased, and there is more time and opportunity for improving the signal quality. In other words, the signal processing method for a touch sensing apparatus and the touch sensing apparatus according to the present invention can improve the efficiency of a sensing process by using a shorter processing time and a smaller transient memory space while keeping precise signal reading.

In conclusion, the signal processing method for a touch sensing apparatus and the touch sensing apparatus according to the present invention, a continuous transient technology can be used to perform a series of signal processing on sensing signals on an entire panel, thereby greatly reducing the quantity of required memories and shortening the signal transmission time in a signal processing procedure, thereby further improving the operation speed of touch control processing, improving the FPS or ensuring that an overall system has more time to perform more precise fine-adjusting operations.

What is claimed is:

1. A signal processing method for a touch sensing apparatus, comprising:
    sequentially dividing sensing signals of a plurality of sensing points on an entire panel into a plurality of signal sequences according to a batch in a signal generation order of the plurality of sensing points; and
    sequentially performing a plurality of signal processing procedures on the plurality of signal sequences,
    wherein the plurality of signal processing procedures respectively correspond to a plurality of buffering spaces, and in the step of sequentially performing a plurality of signal processing procedures on the signal sequences, a signal sequence that has undergone signal processing in one of the plurality of signal processing procedures is first temporarily stored in a buffering space corresponding to the signal processing procedure and then undergoes signal processing in a next signal processing procedure, and a next signal sequence continues to undergo signal processing in the signal processing procedure after signal processing of the signal sequence is completed.

2. The signal processing method for a touch sensing apparatus according to claim 1, further comprising:
    performing touch detection on the plurality of sensing points to generate the sensing signals of the plurality of sensing points on the entire panel.

3. The signal processing method for a touch sensing apparatus according to claim 2, wherein the plurality of sensing points are defined by a plurality of drive electrode lines and a plurality of sensing electrode lines disposed to intersecting with each other.

4. A touch sensing apparatus, comprising:
    a signal sensor, comprising a plurality of sensing points;
    a drive/detection unit, electrically connected to the signal sensor, and performing touch detection on the plurality of sensing points to generate a plurality of sensing signals of the plurality of sensing points; and
    a control unit, electrically connected to the drive/detection unit, and the control unit comprising:
    a sequence generation component, sequentially dividing the plurality of sensing signals into a plurality of signal sequences according to a batch in a signal generation order of the plurality of sensing points;
    a plurality of signal processing components, sequentially connected in series, wherein the signal sequences sequentially undergo signal processing by the signal processing components; and
    a plurality of buffering spaces, wherein a signal sequence that has undergone signal processing by one of the plurality of signal processing components is first temporarily stored in a buffering space corresponding to the signal processing component and then undergoes signal processing by a next signal processing component, and a next signal component continues to undergo signal processing by the signal processing component after signal processing of the signal sequence is completed.

* * * * *